United States Patent
Kuo et al.

(10) Patent No.: US 12,334,929 B2
(45) Date of Patent: Jun. 17, 2025

(54) INPUT HYSTERESIS BUFFER IN OVERDRIVE DESIGN

(71) Applicant: Taiwan Semiconductor Manufacturing Company, Ltd., Hsinchu (TW)

(72) Inventors: Chia-Wei Kuo, Hsinchu (TW); Chia-Jung Chang, Hsinchu (TW); Yu-Kai Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 24 days.

(21) Appl. No.: 18/302,161

(22) Filed: Apr. 18, 2023

(65) Prior Publication Data

US 2024/0356489 A1    Oct. 24, 2024

(51) Int. Cl.
  *H03K 3/3565*  (2006.01)
  *H03B 5/30*    (2006.01)
  *H03K 3/037*   (2006.01)

(52) U.S. Cl.
  CPC .......... *H03K 3/3565* (2013.01); *H03K 3/0377* (2013.01); *H03B 5/30* (2013.01)

(58) Field of Classification Search
  CPC ..................... H03K 3/0377; H03K 3/3565
  See application file for complete search history.

(56) References Cited

U.S. PATENT DOCUMENTS

| | | | | |
|---|---|---|---|---|
| 6,127,898 A | * | 10/2000 | Naura ................ | H03K 3/0231 327/264 |
| 7,026,882 B2 | | 4/2006 | Ganivet et al. | |
| 7,167,032 B1 | * | 1/2007 | Barlow ................ | H03K 3/011 327/205 |
| 9,184,664 B2 | | 11/2015 | Saji | |
| 2004/0217793 A1 | * | 11/2004 | Bertrand ............. | H03K 3/011 327/205 |
| 2005/0062519 A1 | | 3/2005 | Ganivet et al. | |
| 2006/0017482 A1 | * | 1/2006 | Chauhan ............ | H03K 3/3565 327/205 |

(Continued)

FOREIGN PATENT DOCUMENTS

| | | |
|---|---|---|
| TW | I420816 B | 12/2013 |
| TW | I687045 B | 3/2020 |

OTHER PUBLICATIONS

Taiwan Office Action; Application No. 112122375; Dated May 13, 2024.

(Continued)

*Primary Examiner* — Ryan Johnson
(74) *Attorney, Agent, or Firm* — Jones Day

(57) ABSTRACT

Circuits and methods are provided for an input hysteresis buffer that includes a voltage limiting unit, a voltage detecting unit connected to the voltage limiting unit, and a supply tracking bias unit connected to the voltage detecting unit. The voltage liming unit comprises a first voltage limiting unit and a second voltage limiting unit. The voltage detecting unit comprises a first voltage detecting unit configured to detect the presence of a first threshold voltage in an input signal, and a second voltage detecting unit configured to detect the presence of a second threshold voltage in the input signal. The supply tracking bias unit is configured to supply a control signal to the voltage detecting unit.

20 Claims, 12 Drawing Sheets

(56) References Cited

U.S. PATENT DOCUMENTS

2006/0071725 A1* 4/2006 Nunokawa ............... H03B 5/32
331/74
2014/0266366 A1* 9/2014 Williams ............... H03K 3/011
327/205

OTHER PUBLICATIONS

Taiwan Office Action; Application No. 112122375; Dated Dec. 4, 2024.

* cited by examiner

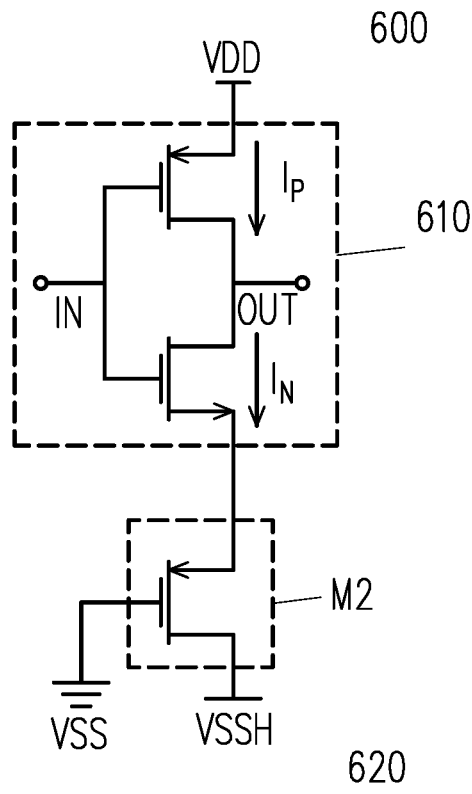

| Variation | | $V_{TH}$ Detector w/supply tracking bias circuit | | | | | | $V_{TL}$ with Compensation |
|---|---|---|---|---|---|---|---|---|
| | | Without Compensation | | | Effect of M2 | | | |
| | | $I_P$ | $I_N$ | $V_{TL}$ | $I_P$ | $I_N$ | $V_{TL}$ | |
| VDD | Increase | ↑ | ↑ | ↑ | - | ↑ | ↓ | Compensate |
| | Decrease | ↓ | ↓ | ↓ | - | ↓ | ↑ | Compensate |
| VDDL | Increase | - | - | - | - | - | - | - |
| | Decrease | - | - | - | - | - | - | - |
| VSSH | Increase | ↑ | ↑ | ↑ | - | ↑ | ↓ | Compensate |
| | Decrease | ↓ | ↓ | ↓ | - | ↓ | ↑ | Compensate |
| NMOS Driving | Increase | - | ↓ | ↑ | - | - | - | - |
| | Decrease | - | ↑ | ↓ | - | - | - | - |
| PMOS Driving | Increase | ↓ | - | ↓ | - | ↓ | ↑ | Compensate |
| | Decrease | ↑ | - | ↑ | - | ↑ | ↓ | Compensate |

FIG. 6

| Variation | | Driver of Oscillator | | | Input Hysteresis Buffer | | | | | | | DC Offset |
|---|---|---|---|---|---|---|---|---|---|---|---|---|
| | | $I_{PX}$ | $I_{NX}$ | PAD DC Level | $I_{PH}$ | $I_{NH}$ | $V_{TH}$ | $I_{PL}$ | $I_{NL}$ | $V_{TL}$ | Center of Window | |
| VDD | Increase | ↑ | ↑ | ↑ | ↑ | ↑ | - | ↑ | - | ↑ | ↑ | Reduced |
| | Decrease | ↓ | ↓ | ↓ | ↓ | ↓ | - | ↓ | - | ↓ | ↓ | Reduced |
| VDDL | Increase | ↓ | - | ↓ | ↓ | ↑ | ↓ | - | - | - | ↓ | Reduced |
| | Decrease | ↑ | - | ↑ | ↑ | ↓ | ↑ | - | - | - | ↑ | Reduced |
| VSSH | Increase | - | ↑ | ↓ | - | - | - | ↓ | ↑ | ↓ | ↓ | Reduced |
| | Decrease | - | ↓ | ↑ | - | - | - | ↑ | ↓ | ↑ | ↑ | Reduced |

FIG. 9B

INPUT HYSTERESIS BUFFER IN OVERDRIVE DESIGN

BACKGROUND

In advanced technology, design constraints can make it difficult to offer high-voltage devices. For example, a crystal oscillator driver may operate at a voltage that is higher than a nominal voltage range of devices in a circuit, requiring complex circuit techniques to avoid problems with reliability. Changes in process, voltage, and temperature (PVT variations) further complicate high-voltage design.

BRIEF DESCRIPTION OF THE DRAWINGS

The following detailed description will be better understood when read in conjunction with the appended drawings. For the purpose of illustration, there is shown in the drawings certain embodiments of the present disclosure. It should be understood, however, that the invention is not limited to the precise arrangements and instrumentalities shown. The accompanying drawings, which are incorporated in and constitute a part of this specification, illustrate an implementation of systems and apparatuses consistent with the present invention and, together with the description, serve to explain advantages and principles consistent with the invention.

FIG. 6 is a circuit diagram depicting a portion of another voltage detector in accordance with an embodiment.

FIG. 9 is circuit diagram depicting a circuit for use in overdrive design in accordance with an embodiment. FIG. 9B depicts a table summarizing some effects of the circuit according to an embodiment.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
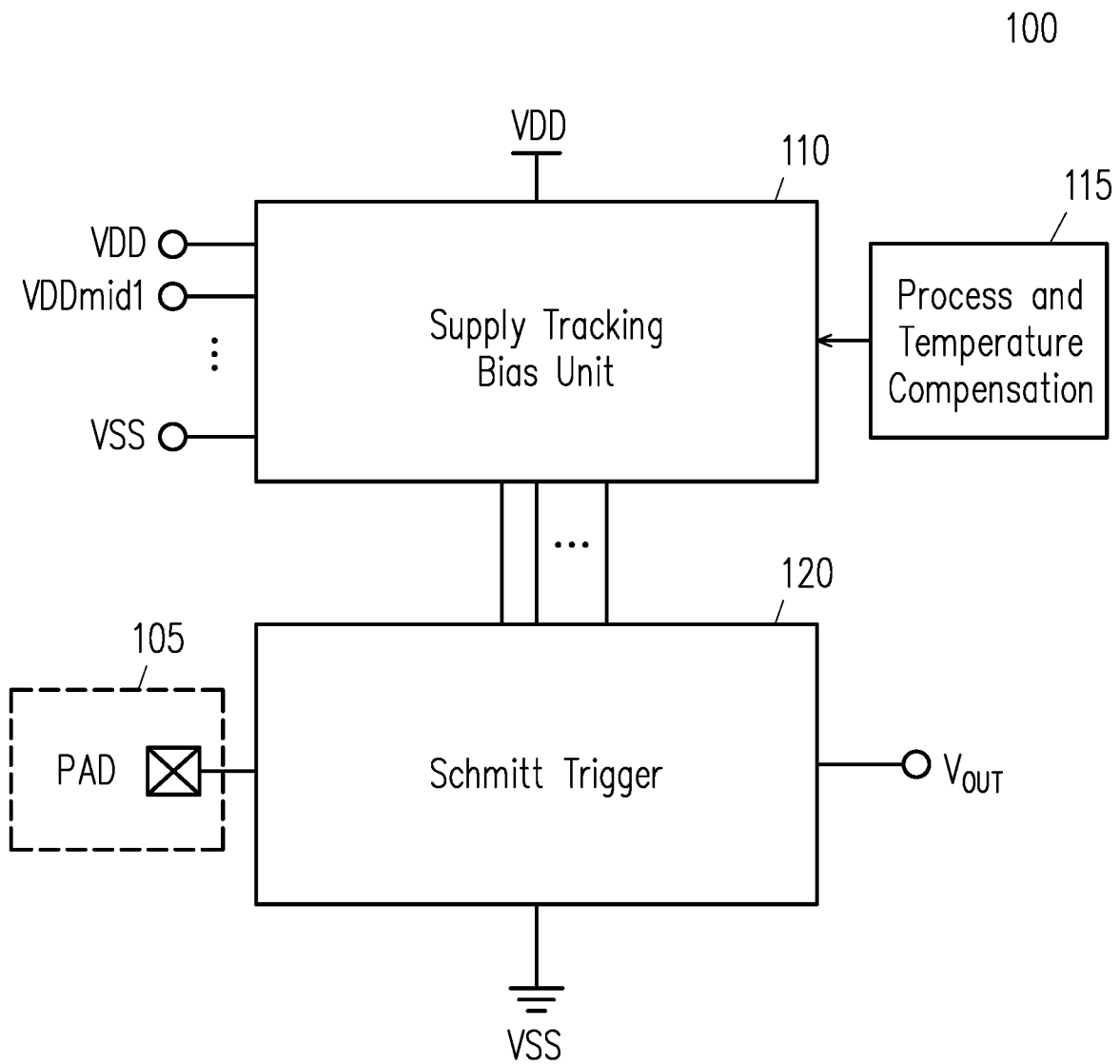
FIG. 1 is a block diagram depicting an input hysteresis buffer in accordance with an embodiment.

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It is to be understood that the phraseology and terminology employed herein are for the purpose of description and should not be regarded as limiting. For example, the use of a singular term, such as, "a" is not intended as limiting of the number of items. Also the use of relational terms, such as but not limited to, "top," "bottom," "left," "right," "upper," "lower," "down," "up," "side," are used in the description for clarity and are not intended to limit the scope of the invention or the appended claims. Further, it should be understood that any one of the features can be used separately or in combination with other features. Other systems, methods, features, and advantages of the invention will be or become apparent to one with skill in the art upon examination of the detailed description. It is intended that all such additional systems, methods, features, and advantages be included within this description, be within the scope of the present invention, and be protected by the accompanying claims.

Overdrive design may require complicated circuit techniques to ensure that devices are not damaged or otherwise compromised by applied voltages above their nominal operating range. As a result, certain systems may utilize an overdrive design that facilitates operating such circuits at high-voltage. Crystal oscillator architectures may include a Schmitt trigger to stabilize a digital output of the oscillator in the presence of noise and external influences. But adopting conventional Schmitt triggers into overdrive design may result in difficulties in meeting input threshold hysteresis buffer requirements while maintaining oscillator performance with respect to startup time and phase noise.

In some instances voltage limiters may be implemented as a protection measure for these devices. However, in crystal oscillator design, this can cause a DC bias gap between the crystal oscillator driver and the Schmitt trigger or hysteresis buffer. This gap may increase startup time and phase noise. Additionally, variations in process, voltage, and temperature (PVT variation) cause further offset between the DC bias level of the signal provided by the crystal oscillator driver and the hysteresis window.

Various embodiments described herein relate generally to circuit design, and more specifically relate to circuits and methods that provide compensation for PVT variation in overdrive design. By incorporating compensation components and supply tracking bias units into the circuit design, fluctuations in performance caused by PVT variation can be offset leading to a more reliable hysteresis buffer. Certain embodiments described herein utilize supply tracking bias units to supply a control signal to voltage detectors of an input hysteresis buffer. The voltage detectors are used to determine whether an input signal is above threshold voltages that define the hysteresis window of the input hysteresis buffer. The control signal, and various components within the voltage detectors, provide compensation for variations in these threshold voltage values caused by PVT variation on the circuit. Through this compensation, variation of the hysteresis window is minimized and offset between the DC bias level of the input signal and the center of the hysteresis window is reduced.

FIG. 1 is a block diagram depicting an overview of an input hysteresis buffer 100 of the present disclosure incorporating a supply tracking bias unit 110 in accordance with an embodiment. A Schmitt trigger 120 is configured to receive a PAD signal 105. The voltage of the PAD signal 105 varies over time between a minimum voltage value and a maximum voltage value. The Schmitt trigger 120 is incorporated to clean up noise in the PAD signal 105 and sharpen the rise and fall of the voltage signal into a square wave signal that is output at $V_{OUT}$ to other devices in the design. This translation is accomplished by defining a hysteresis window between a higher threshold voltage on the rising edge of the signal and a lower threshold voltage on the falling edge of the signal. As the PAD signal 105 rises from minimum to maximum voltage, the Schmitt trigger 120 switches its output from low to high when the pad signal 105 crosses the higher threshold voltage. As the PAD signal 105 falls back from maximum to minimum voltage, the Schmitt trigger 120 switches its output from high to low when the pad signal 105 crosses the lower threshold voltage.

Performance of the Schmitt trigger 120 may be improved by incorporating the supply tracking bias unit 110 which adopts a process and temperature compensation technique 115. Absent this unit, PVT variation may cause variation in the hysteresis window leading to false transitions and weaker noise rejection, as well as causing offset between the DC bias level of the PAD signal 105 and the center of the hysteresis window. As will be shown in further detail with respect to the figures that follow, implementing the supply tracking bias unit 110 allows for better control of the threshold voltages of the Schmitt trigger. These voltages are compensated in a reverse trend so as to resist supply voltage variation. Incorporating the process and temperature compensation technique 115 into the supply tracking bias unit provides full PVT compensation to the Schmitt trigger 120, ensuring reliability of the hysteresis window and transition voltages. In embodiments described herein, the supply tracking bias unit 110 and Schmitt trigger 120 operate between a minimum voltage VSS and a maximum voltage VDD. However, the present disclosure is not so limited, and these units may be utilized with intervening voltage levels (for example VDDmid1 as shown in FIG. 1).

Figure 2:
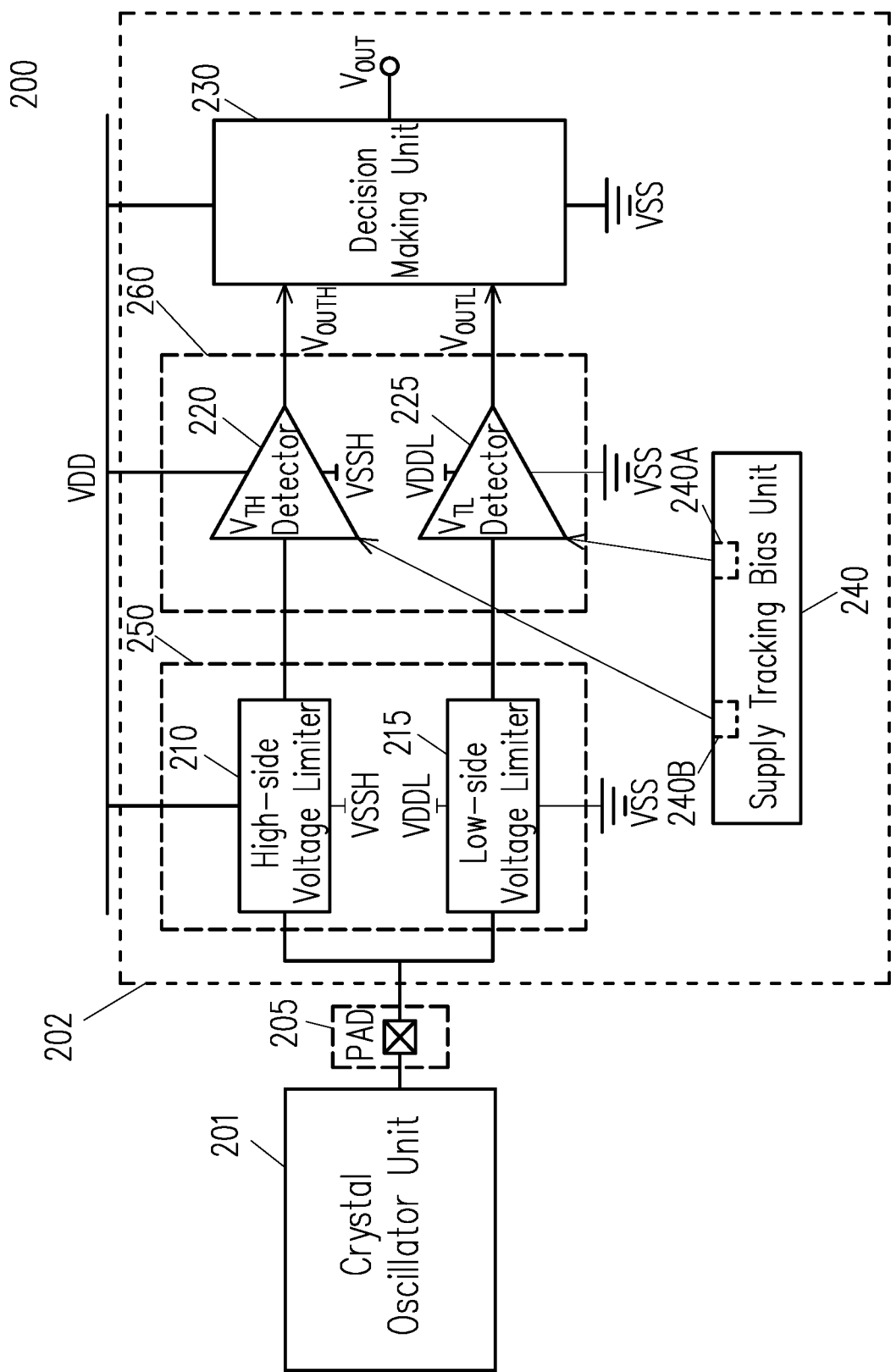
FIG. 2 is a block diagram depicting a circuit for an overdriven crystal oscillator that includes an input hysteresis buffer in accordance with an embodiment.

FIG. 2 is a block diagram depicting a circuit for an overdriven crystal oscillator 200 incorporating an input hysteresis buffer 202 according to some embodiments. The circuit includes a crystal oscillator unit 201 that outputs a PAD signal 205 to an input hysteresis buffer 202 comprising a voltage limiting unit 250, a voltage detecting unit 260 which incorporates a supply tracking biasing unit 240, and a decision maker 230. In a particular embodiment, the signal varies between minimum value VSS and maximum value VDD. The circuit may be designed to set the lower threshold voltage $V_{TL}$ and upper threshold $V_{TH}$ such that the center of the of the hysteresis window corresponds with the DC bias level of the PAD signal 205.

The input hysteresis buffer 202 translates the PAD signal 205 into an output signal $V_{OUT}$ having sharp edges and defining a hysteresis window between low threshold voltage $V_{TL}$ and high threshold voltage $V_{TH}$. The voltage limiting unit 250 and voltage detecting unit 260 take the PAD signal 205 as an input and outputs signals corresponding to the presence of the threshold voltages to the decision making unit 230. The decision making unit 230 then outputs $V_{OUT}$ based on the presence of the threshold voltages.

In some embodiments, the crystal oscillator unit 201 comprises an overdriven crystal oscillator driver that is a self-biasing buffer with non-rail-to-rail signal. This scenario is depicted in the figures that follow, but the present disclosure is not so limited and may incorporate drivers having different characteristics.

Initially, the voltage limiting unit 250 splits the PAD signal 205 into two paths. A first path runs through a low-side voltage limiter 215 and a low-side voltage detector 225 so as to determine whether the PAD signal 205 is above a lower threshold voltage $V_{TL}$. The low-side voltage limiter 215 receives a portion of the PAD signal 205 and converts the signal from a signal varying between VSS and VDD into one that varies between VSS and an intermediate voltage VDDL. This signal is passed on to the lower threshold voltage detector 225.

The lower threshold voltage detector 225 evaluates whether the signal from the low-side voltage limiter 215 is above or below the lower threshold voltage $V_{TL}$. Based on the signal received from low-side voltage limiter 215, the lower threshold voltage detector 225 outputs a signal $V_{OUTL}$ that is in a first state when the input signal is below $V_{TL}$ and in a second state when the input signal is above $V_{TL}$. This translation is described in greater detail below with respect to FIG. 3.

The lower threshold voltage detector 225 incorporates a supply tracking bias unit 240. The supply tracking bias unit may comprise a plurality of units 240A/240B. In an embodiment, a first unit 240A supplies a control signal to the lower threshold voltage detector 225 that assists in compensating for fluctuations in $V_{TL}$ caused by PVT variations. By incorporating the supply tracking bias unit, the lower threshold voltage detector provides better control of the lower threshold voltage and protects against variations in the hysteresis window.

The second path runs through a high-side voltage limiter 210 and a high-side voltage detector 220 so as to determine whether the PAD signal 205 is above an upper threshold voltage $V_{TH}$. The high-side voltage limiter 210 receives a portion of the PAD signal 205 and converts the signal from a signal varying between VSS and VDD into one that varies between an intermediate voltage VSSH and VDD. This signal is passed on to the higher threshold voltage detector 215.

The higher threshold voltage detector 215 evaluates whether the signal from the high-side voltage limiter 210 is above or below the higher threshold voltage $V_{TH}$. Based on the signal received from high-side voltage limiter 210, the higher threshold voltage detector 220 outputs a signal $V_{OUTH}$ that is in a first state when the input signal is below $V_{TH}$ and in a second state when the input signal is above $V_{TH}$. This translation is described in greater detail below with respect to FIG. 3.

The higher threshold voltage detector 220 incorporates a supply tracking bias unit 240. In an embodiment, a second unit of the supply tracking bias unit supplies 240B a control signal to the higher threshold voltage detector 220 that assists in compensating for fluctuations in $V_{TH}$ caused by PVT variations. By incorporating the supply tracking bias unit, the lower threshold voltage detector provides better control of the lower threshold voltage and protects against variations in the hysteresis window.

The decision maker 230 then evaluates the signals $V_{OUTL}$ and $V_{OUTH}$ to create a final output $V_{OUT}$ that incorporates a hysteresis window between $V_{TL}$ and $V_{TH}$. Operation of these paths is discussed further with reference to FIG. 3.

Figure 3:
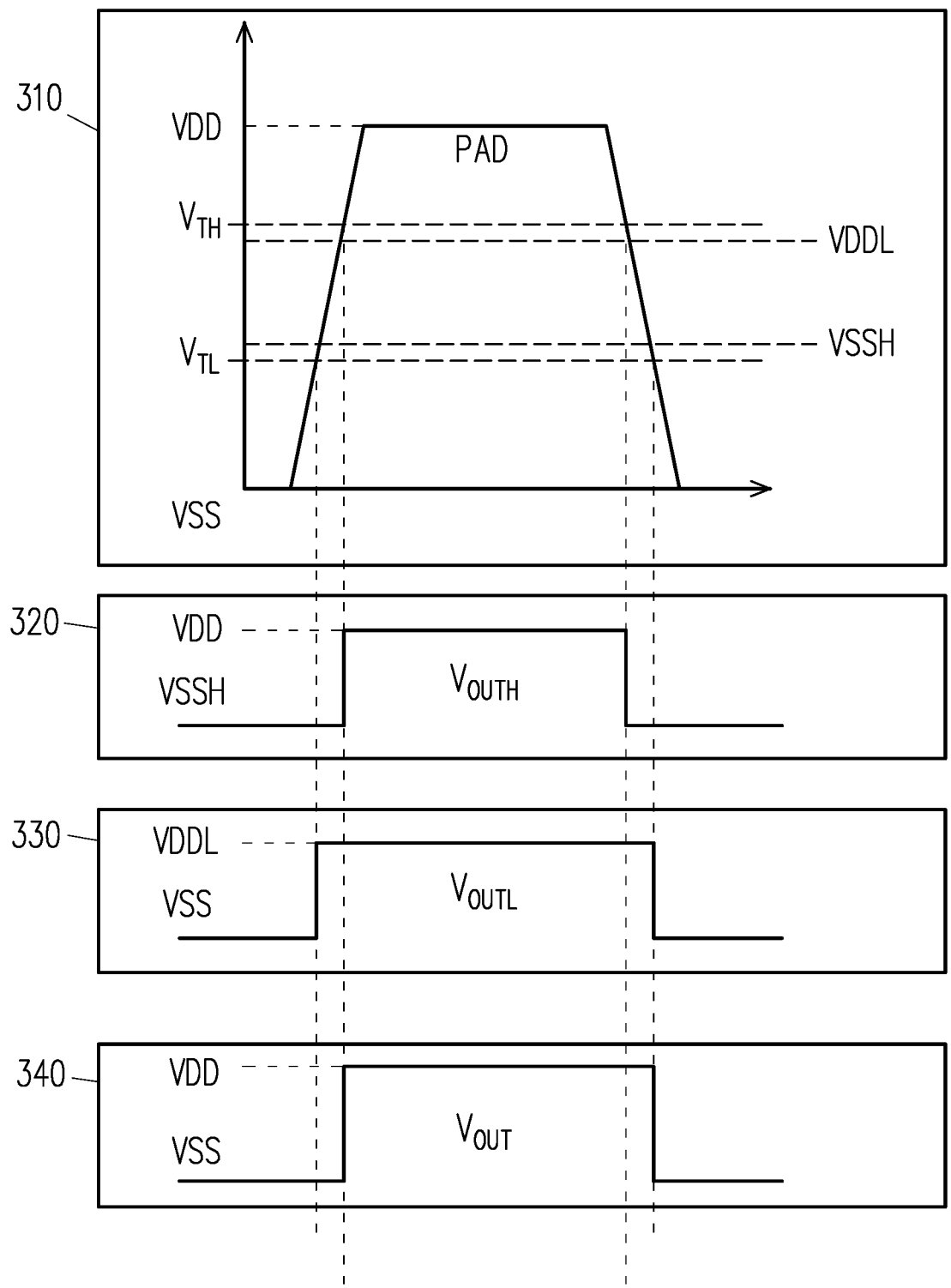
FIG. 3 is a graphical illustration depicting a function of the input hysteresis buffer in accordance with an embodiment.

FIG. 3 depicts graphs showing voltage over time for a circuit for an overdriven crystal oscillator incorporating an input hysteresis buffer according to an embodiment. Graph 310 depicts a period of the PAD signal 205. In an embodiment, the signal may vary between minimum voltage VSS and maximum voltage VDD. The circuit may be designed to set the lower threshold voltage $V_{TL}$ and upper threshold $V_{TH}$ such that the center of the of the hysteresis window corresponds with the DC bias level of the PAD signal 205.

Graph 320 depicts the function of the path through the high-side of the circuit 200. The high-side voltage limiter 210 passes a corresponding portion of the PAD signal between an intermediate level VSSH and VDD through to the high-side voltage detector 220. The high-side voltage detector 220 makes a determination as to whether the input signal is above the higher threshold voltage $V_{TH}$. As seen in graph 320, the output $V_{OUTH}$ of the high-side voltage detector 220 is a square wave that switches when the higher threshold voltage level is crossed.

Graph 330 depicts the function of the path through the low-side of the circuit 200. The low-side voltage limiter 215 passes a corresponding portion of the PAD signal between VSS and an intermediate level VDDL through to the low-side voltage detector 220. The low-side voltage detector 220 makes a determination as to whether the input signal is above the lower threshold voltage $V_{TL}$. As seen in graph 330, the output $V_{OUTL}$ of the low-side voltage detector 215 is a square wave that switches when the lower threshold voltage level is crossed.

Both the high-side voltage detector 220 and the low-side voltage detector 215 incorporate the supply tracking bias unit 240. The supply tracking bias unit compensates $V_{TH}$ and $V_{TL}$ in order to resist power variation. Exemplary mechanisms for supplying the compensation are discussed in further detail below with respect to FIGS. 7 and 8.

The output signal from each path, $V_{OUTH}$ and $V_{OUTL}$, are then passed to the decision making unit 230 which controls the final output $V_{OUT}$ of the circuit. A graphical illustration of this process is shown in graph 340 of FIG. 3. The decision maker compares the $V_{OUTH}$ and $V_{OUTL}$ pulses and outputs a signal $V_{OUT}$ that switches from low to high when the input signal crosses over the higher threshold voltage, and switches from high to low when the input crosses back over the lower threshold voltage. The decision making unit 230 may comprise a set of logic gates, or any other means, to synthesize the input signals and generate the desired hysteresis window between the lower threshold voltage and the higher threshold voltage.

Figure 4:
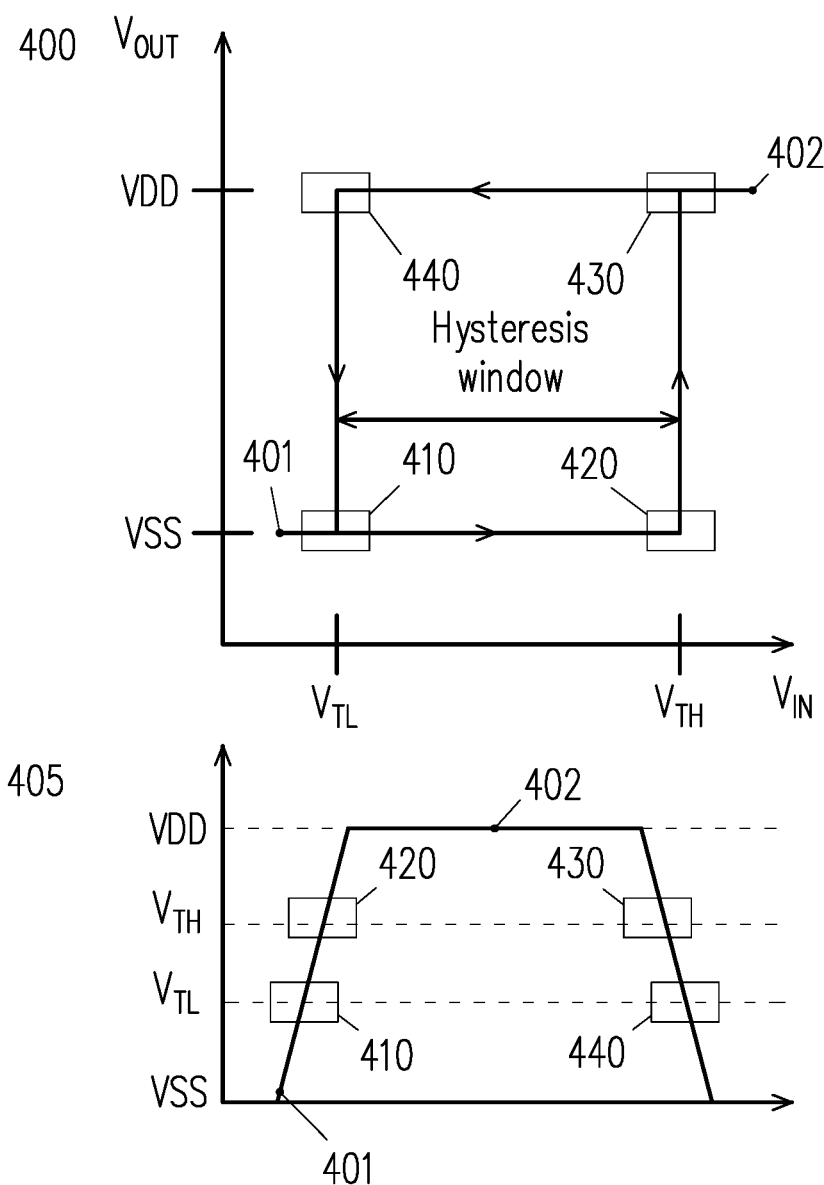
FIG. 4 is a graphical illustration depicting a hysteresis window generated in accordance with an embodiment.

FIG. 4 depicts a graphical illustration of a hysteresis window formed according to an embodiment. Graph 400 shows an output voltage $V_{OUT}$ of an example circuit compared to the voltage input to the input hysteresis buffer from the PAD signal. Graph 405 shows a period of the PAD signal. As the signal progresses from left to right in graph 405, the input voltage and output voltage shown in graph 400 progress in the direction as depicted by the arrows on the graph. Boxes 410, 420, 430, and 440 are events that occur simultaneously in both 400 and 405.

During an example period of signal propagation, the PAD signal begins at a minimum value VSS. This starting point is represented in graph 400 as point 401. As the PAD signal moves from VSS to VDD, the voltage initially crosses the lower threshold voltage $V_{TL}$ at box 410. The input hysteresis buffer functions such that the output voltage, $V_{OUT}$ in graph 400, remains VSS through box 410, even as the input voltage grows.

The value of the input voltage continues to grow and crosses through the higher threshold voltage $V_{TH}$ at box 420. As shown in graph 400, when $V_{TH}$ is crossed, the output voltage switches to the maximum level, here represented as VDD. The output voltage maintains the maximum value while the PAD signal remains above $V_{TH}$. For example, point 402 represents a time where PAD signal input is at its maximum. Graph 400 shows this point where $V_{IN}$ is greater than $V_{TH}$. Here, the output voltage $V_{OUT}$ of the input hysteresis buffer remains at VDD as the input voltage value falls from 402 back towards the threshold voltages.

At box 430, the PAD signal falls below the higher threshold voltage $V_{TH}$. Here, where the PAD signal is on the falling edge, the input hysteresis buffer maintains an output voltage of VDD as the signal passes the $V_{TH}$ level and approaches the lower threshold voltage $V_{TL}$. At 440, the input voltage swings back below $V_{TL}$, and at this point the output voltage switches back to the VSS level. In this way, the input hysteresis buffer causes the output voltage to switch at the higher threshold voltage $V_{TH}$ on the rising edge of the input signal, and the lower threshold voltage $V_{TL}$ on the falling edge of the input signal. This defines a hysteresis window between $V_{TL}$ and $V_{TH}$ that may prevent erroneous switching due to noise or PVT variation.

Figure 5:
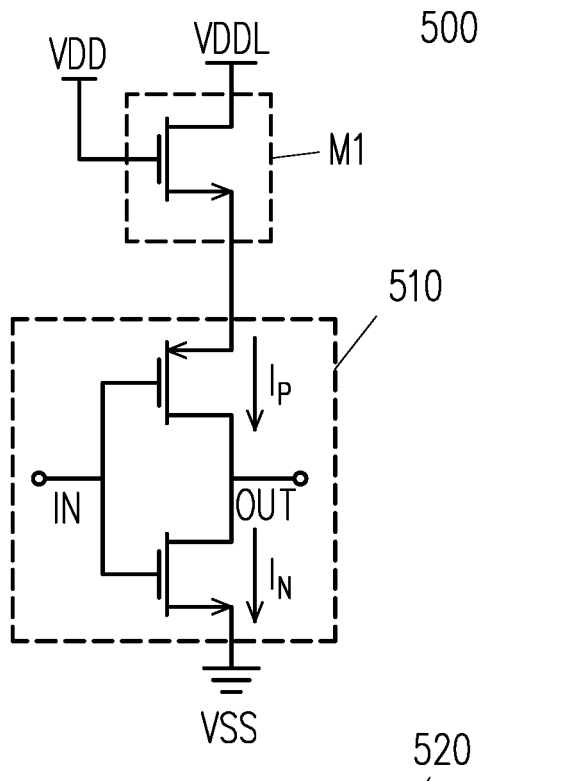
FIG. 5 is a circuit diagram depicting a portion of a voltage detector in accordance with an embodiment.

FIG. 5 is a circuit diagram depicting a portion of a voltage detector incorporating a supply tracking bias unit in accordance with an embodiment. Voltage detector 500 may be a lower threshold voltage detector of the circuits described above, configured to detect the presence of $V_{TL}$ in an input signal. The voltage detector may be connected between VSS and intermediate voltage VDDL. A signal from the low-side voltage limiter is received as input by a complimentary metal-oxide-semiconductor (CMOS) inverter 510 of the voltage detector 500. The detector further comprises a compensation component M1 that may provide compensation for PVT variations.

M1 is a control circuit implemented in series between supply voltage VDDL and the CMOS inverter. In the embodiment shown in FIG. 5, M1 comprises an n-type metal-oxide-semiconductor (NMOS) transistor having a gate connected to a voltage supply equal to the maximum PAD voltage VDD. The addition of this control circuit M1 can compensate voltage variation of the supply VDDL, and can partially compensate for process and temperature variation. The impact of the addition of control circuit M1 is shown in table 520. The table shows how variations in various supply voltages affect current through the PMOS ($I_P$) and NMOS ($I_N$) transistors of the CMOS inverter, as well as how these variations affect the lower threshold voltage $V_{TL}$.

For example, an increase in VDDL due to voltage variation would, absent M1, cause an increase in current across the transistors in the CMOS and, consequently, an increase in the lower threshold voltage $V_{TL}$. However, the addition of control circuit M1 between VDDL and the PMOS component of the CMOS inverter introduces a corresponding decrease in the current through the PMOS transistor and, consequently, a corresponding decrease in the lower threshold voltage $V_{TL}$. In this way, the control circuit M1 is able to provide compensation for the voltage variation. As shown in 520, a similar effect occurs if the VDDL supply unexpectedly decreases, wherein the control circuit M1 is able to provide compensation in the opposite direction.

In addition to provided compensation for variation in the VDDL supply voltage, the control circuit M1 helps to provide compensation for variations in the driving voltage of the NMOS component of the CMOS inverter that arise from process and temperature variation. For example, an increase in $V_{TL}$ caused by process or temperature variation that increases the current through the NMOS is compensated by a corresponding drop in $V_{TL}$ due to the presence of control circuit M1.

Another feature introduced by the inclusion of control circuit M1 into the low-side voltage detector is a dependency of $V_{TL}$ on VDD. As shown in the table, by adding M1, $V_{TL}$ increases in response to any increase in VDD caused by PVT variation, and a corresponding decrease occurs in response to any decrease in VDD. This dependency is intentionally introduced in order to compensate for a DC bias gap between the PAD signal and the input hysteresis buffer.

FIG. 6 is a circuit diagram depicting a portion of a voltage detector incorporating a supply tracking bias unit in accordance with an embodiment. Voltage detector 600 may be a higher threshold voltage detector of the circuits described above, configured to detect the presence of $V_{TH}$ in an input signal. The voltage detector may be connected between an intermediate voltage VSSH and VDD. A signal from the low-side voltage limiter is received as input by a complimentary metal-oxide-semiconductor (CMOS) inverter 610 of the voltage detector 600. The detector further comprises a compensation component M2 that may provide compensation for PVT variations.

M2 is a control circuit implemented in series between supply voltage VSSH and the CMOS inverter. In a particular embodiment shown in FIG. 6, M2 comprises a p-type metal-oxide-semiconductor (PMOS) transistor connected. A gate of the PMOS transistor is connected to a voltage supply equal to the minimum PAD voltage VSS. The addition of this control circuit M2 can compensate voltage variation of the supply VSSH, and can partially compensate for process and temperature variation. The impact of the addition of M2 is shown in table 620. The table shows how variations in various supply voltages affect current through the PMOS ($I_P$) and NMOS ($I_N$) transistors of the CMOS inverter, as well as how these variations affect the higher threshold voltage $V_{TH}$.

For example, an increase in VDD due to voltage variation would, absent M2, cause an increase in current across the transistors in the CMOS and, consequently, an increase in the lower threshold voltage $V_{TH}$. However, the addition of control circuit M2 between VSSH and the NMOS component of the CMOS inverter introduces compensates for this variation by introducing a corresponding decrease in the higher threshold voltage. As shown in 620, a similar effect occurs if the VDD supply unexpectedly decreases, wherein the control circuit M2 is able to provide compensation in the opposite direction. Table 620 further demonstrates the manner in which M2 helps to provide compensation for variations in the VSSH voltage.

In addition to provided compensation for variation in the power supply voltages, the control circuit M2 helps to provide compensation for variations in the driving voltage of the PMOS component of the CMOS inverter that arise from process and temperature variation. For example, a decrease in $V_{TH}$ caused by an increase in the driving voltage of the PMOS is compensated by a corresponding increase in $V_{TH}$ due to the presence of control circuit M2.

Although the addition of M1 and M2 provides the benefits described above, the performance of the voltage detectors may be further improved by adding additional compensation components and connecting the voltage detectors to a control signal supplied by the supply tracking bias unit, as described below with respect to FIGS. 7-8.

Figure 7:
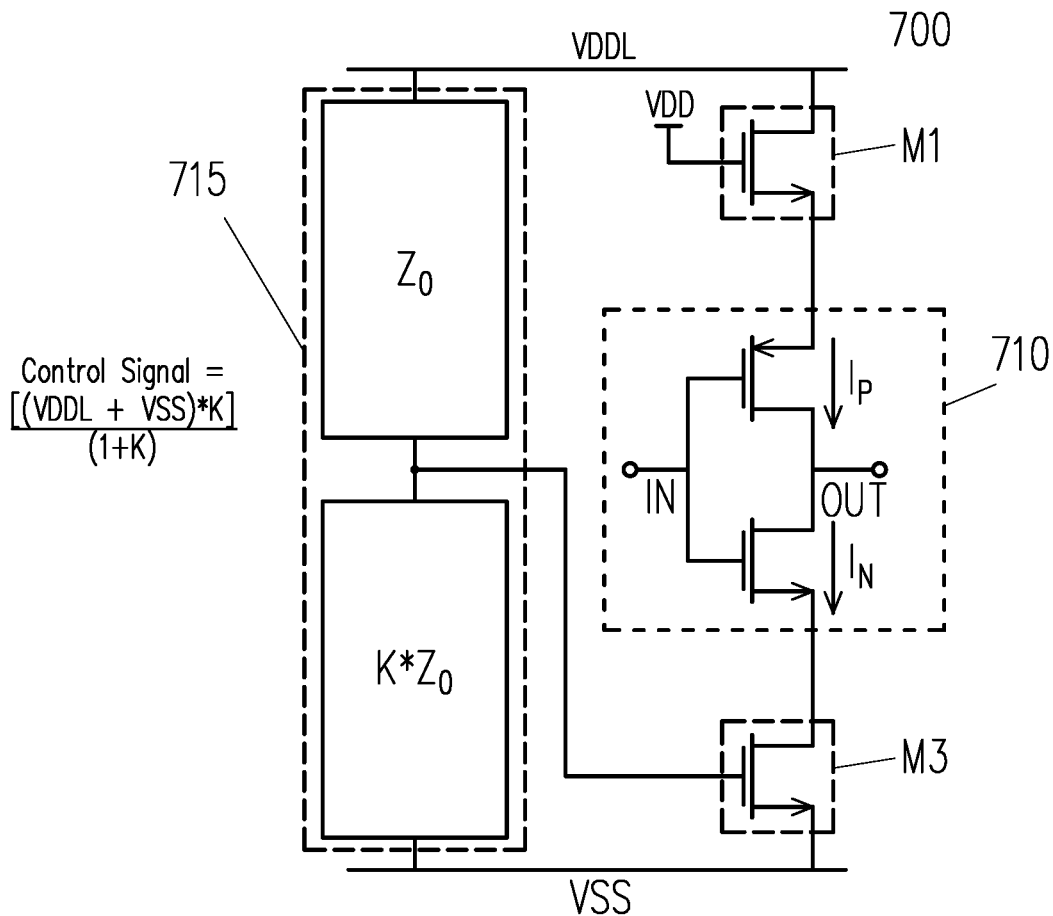
FIG. 7 is a circuit diagram depicting a voltage detector with a supply tacking bias unit in accordance with an embodiment.

FIG. 7 is a circuit diagram depicting a voltage detector with a supply tacking bias unit in accordance with an embodiment. The circuit 700 may be a lower threshold voltage detector connected to supply tracking bias unit 715. The voltage detector in FIG. 7 is similar to that of FIG. 5, but includes an additional component M3. In an embodiment, M3 is a controlled resistance component connected in series between a CMOS inverter and the minimum voltage VSS. The controlled resistance component M3 may comprise an NMOS transistor with a gate that is connected to a control signal from the supply tracking bias unit 715. The present disclosure is not, however, so limited. For example, the controlled resistance component M3 may instead be a voltage controlled resistor. The control signal supplied to M3 by the supply tracking bias unit 715 sets the resistance of M3 so as to provide increased compensation against PVT variation and the DC bias gap between the PAD DC level and the hysteresis window.

The impact of adding controlled resistance element M3 and supply tracking bias unit 715 is shown in table 715. The supply tracking bias circuit can be configured as a voltage divider so as to supply a specific control signal to M3. In an embodiment depicted in FIG. 7, series impedances are selected such that the control signal is a fraction of VDDL. As a result, fluctuations in $V_{TL}$ cause by variations in VDDL across the low-side voltage detector are compensated by the resistance of M3.

Figure 8:
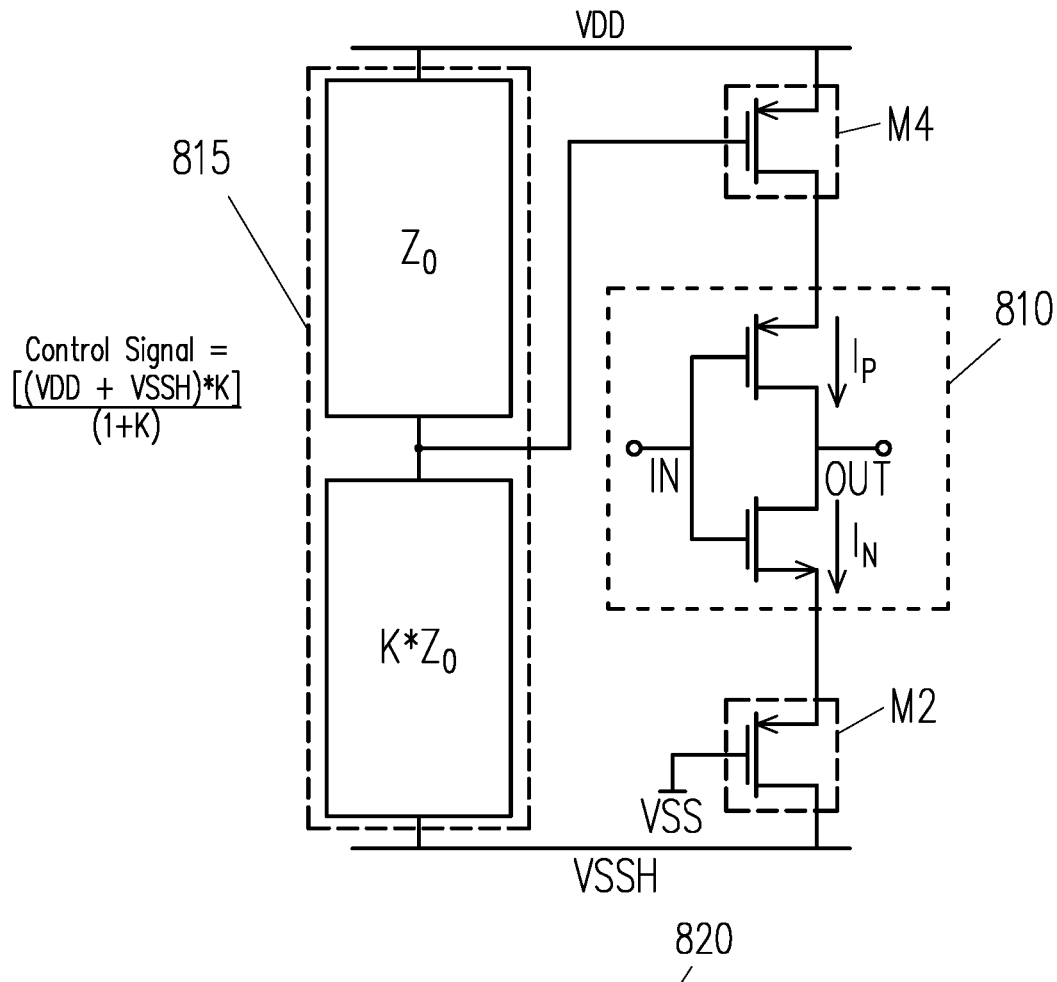
FIG. 8 is a circuit diagram depicting another voltage detector with a supply tracking bias unit in accordance with an embodiment.

FIG. 8 is a circuit diagram depicting another voltage detector with a supply tacking bias unit in accordance with an embodiment. The circuit 800 may be a higher threshold voltage detector connected to supply tracking unit 815. The voltage detector in FIG. 8 is similar to that of FIG. 6, but includes component M4. In an embodiment, M4 is a controlled resistance component connected in series between the maximum voltage VDD and a CMOS inverter 810. The controlled resistance component M4 may comprise a PMOS transistor with a gate that is connected to a control signal from the supply tracking bias unit 815. The present disclosure is not, however, so limited. For example, the controlled resistance component M4 may instead be a voltage controlled resistor. The control signal applied to by the supply tracking bias unit 815 sets the resistance of M4 so as to provide increased compensation against PVT variation and the DC bias gap between the PAD DC level and the hysteresis window.

Table 820 summarizes the impact of adding controlled resistance component M4 to the high-side voltage detector. The supply tracking bias circuit can be configured as a voltage divider so as to supply a specific control signal to M4. In an embodiment depicted in FIG. 8, series impedances are selected such that the control signal is a function of VDD and VSSH. As a result, fluctuations in $V_{TH}$ caused by variations in VDD and VSSH across the low-side voltage detector are compensated by the resistance of M4.

Figure 9A:
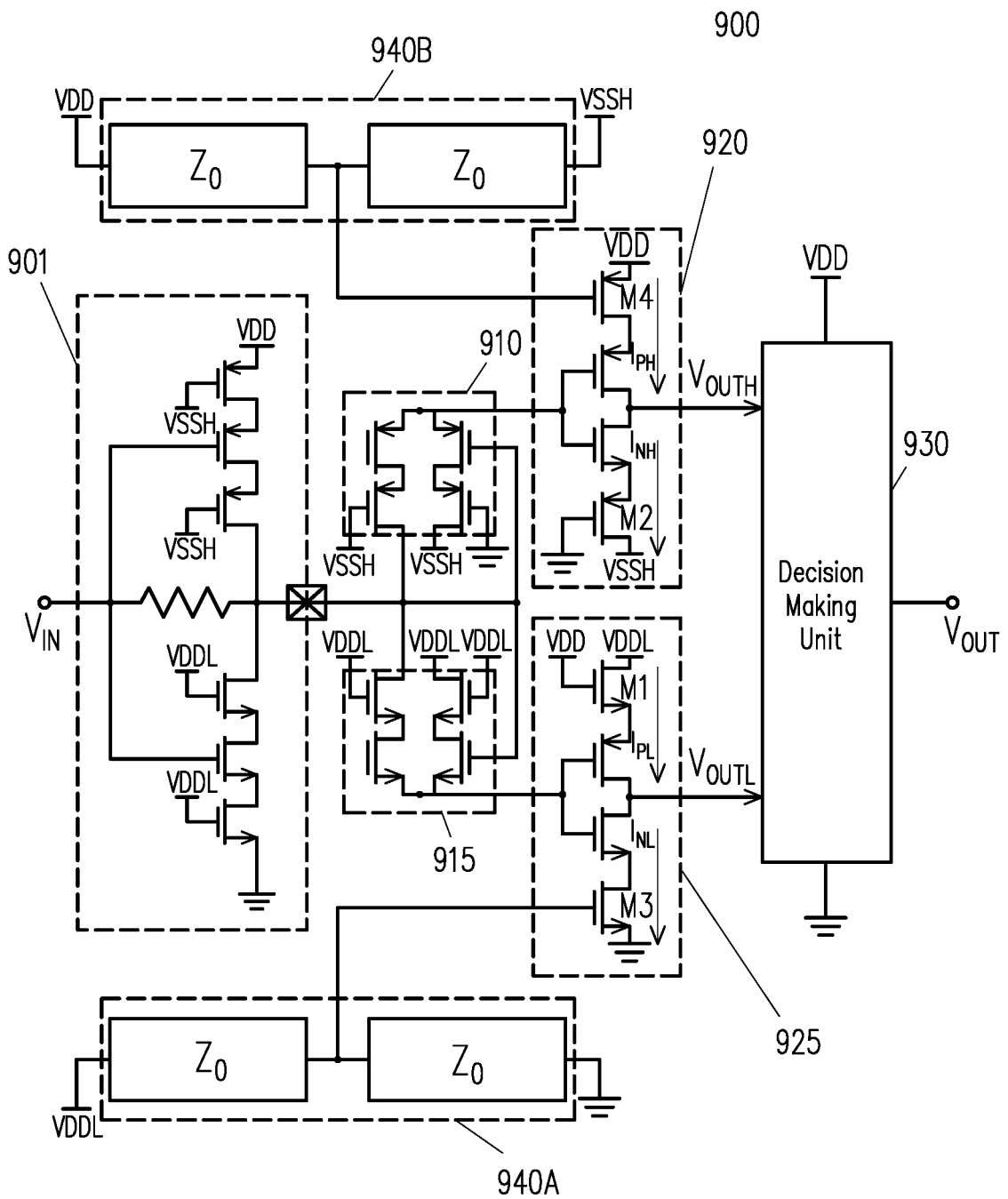
FIG. 9A depicts the circuit diagram according to an embodiment.

FIG. 9A depicts a circuit diagram of an overdriven crystal oscillator circuit 900 that incorporates a supply tracking bias unit according to an embodiment. This diagram shows the specific makeup of various units previously discussed with respect to FIG. 2. In the embodiment of FIG. 9, the crystal oscillator unit comprises a driver circuit 901 that outputs a PAD signal. The PAD signal may then be divided into first and second paths by a low-side voltage limiter 915 and a high-side voltage limiter 910. Each voltage limiter comprises a set of transistors configured such that the high-side voltage limiter 910 passes on a signal defined between VSSH and VDD while the low-side voltage limiter 915 passes on a signal defined between VSS and VDDL. These signals may pass through to a low-side voltage detector 925 and a high-side voltage detector 920, each voltage detector incorporating a supply tracking bias unit 940A/940B. These components may be the same as those discussed previously with respect to FIGS. 7 and 8.

The low-side voltage detector 925 is configured to detect when the signal passed on from the low-side voltage limiter 915 is above and below the lower threshold voltage $V_{TL}$. To stabilize this measurement, the low-side voltage detector may include compensation components M1 and M3, and be connected to supply tracking bias unit 940A. The supply tracking bias unit 940A supplies a signal to control the resistance of M3. As discussed in greater detail above with respect to the tables shown in FIGS. 5-8, by implementing these measures, the circuit may provide compensation against variations in threshold voltages caused by PVT variation. The compensation components and supply tracking bias unit also protect against a gap between the DC level of the input signal and a center of the hysteresis window defined between the threshold voltages. For example, an unforeseen variation that increases the level of VDDL has a corresponding decrease in the DC level of the PAD signal. Utilizing M1, M3, and the supply tracking bias unit 940A can introduce a decrease in the level of $V_{TL}$ in response, resulting in the center of the hysteresis window being moved in that direction and thereby reducing the offset between the DC level and the center of the window. The table depicted in FIG. 9B shows these effects in more detail.

The high-side voltage detector 920 is configured to detect when the signal passed on from the low-side voltage limiter 910 is above and below the higher threshold voltage $V_{TH}$. To stabilize this measurement, the high-side voltage detector may include compensation components M2 and M4, and be connected to supply tracking bias unit 940B. The supply tracking bias unit 940B supplies a signal to control the resistance of M4. As discussed in greater detail above with respect to the tables shown in FIGS. 5-8, by implementing these measures, the circuit may provide compensation against variations in threshold voltages caused by PVT variation. The compensation components and supply tracking bias unit also protect against a gap between the DC level of the input signal and a center of the hysteresis window defined between the threshold voltages. For example, an unforeseen variation that increases the level of VSSH has a corresponding decrease in the DC level of the PAD signal. Utilizing M2, M4, and the supply tracking bias unit 940B can introduce a decrease in the level of $V_{TH}$ in response, resulting in the center of the hysteresis window being moved in that direction and thereby reducing the offset between the DC level and the center of the window. The table depicted in FIG. 9B shows these effects in more detail.

The voltage detectors 920 and 925 are configured to output signals $V_{OUTL}$ and $V_{OUTH}$ based upon whether the input signals are above or below threshold voltages levels. $V_{OUTL}$ and $V_{OUTH}$ are then received by a decision making unit 930 that compares the signals and outputs a final voltage signal $V_{OUT}$. The output signal $V_{OUT}$ varies between VSS and VDD and defines a hysteresis window between $V_{TL}$ and $V_{TH}$ such that the signal switches from VSS to VDD on the rising edge when the input signal reaches $V_{TH}$ and switches from VDD to VSS on the falling edge with the input signal falls below $V_{TL}$.

FIG. 9B shows a table summarizing some effects of the circuit of FIG. 9A, in accordance with an embodiment. The addition of the compensation components in the voltage detectors and the incorporation of the supply tracking bias units reduces offset between the DC bias level of the PAD signal and the center of the hysteresis window defined by the lower and upper threshold voltages. Table 975 shows how the fluctuations in the PAD DC level and the threshold voltages are compensated in the circuit.

Figure 10:
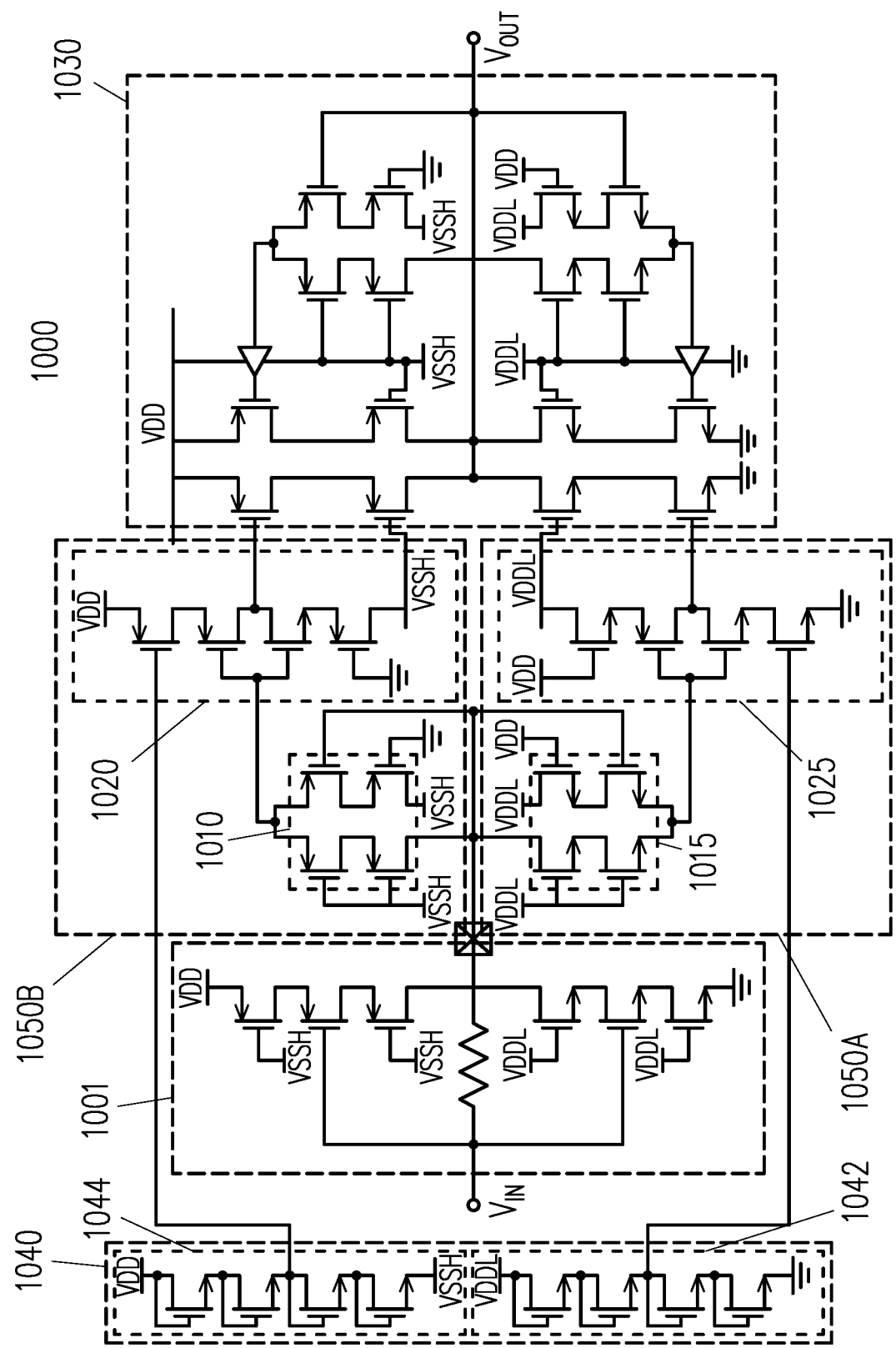
FIG. 10 is a circuit diagram depicting another circuit for use in overdrive design in accordance with an embodiment.

FIG. 10 depicts an overdriven crystal oscillator 1000 incorporating compensation components and supply tracking bias units according to an embodiment. In this embodiment, the supply tracking unit 1040 comprises two control signal generators including a number of transistors. The circuit comprises a low-side control signal generator 1042 configured to supply a signal to the low-side voltage detector 1025 and control the resistance of a compensation component therein, and a high-side control signal generator 1044 configured to supply a signal to the high-side voltage detector 1020 and control the resistance of a compensation component therein.

The transistors making up the low-side control signal generator 1042 are connected between VSS and VDDL. As such, the signal supplied to the low-side voltage detector 1025 depends on the supplies VSS and VDDL. In situations where PVT variation has an effect on VSS or VDDL, the signal supplied by the low-side control signal generator 1042 may incorporate this fluctuation and compensate accordingly.

The transistors making up the high-side control signal generator 1044 are connected between VSSH and VDD. As such, the signal supplied to the high-side voltage detector 1020 depends on the supplies VSSH and VDDL. In situations where PVT variation has an effect on VSSH or VDDL, the signal supplied by the high-side control signal generator 1044 may incorporate this fluctuation and compensate accordingly.

As shown in FIG. 10, the low-side voltage limiter 1015 and low-side voltage detector 1025 define a first judgment path 1050A for determining whether the PAD supply is above the lower threshold voltage $V_{TL}$. The high-side voltage limiter 1010 and high-side voltage detector 1020 define a second judgment path 1050B for determining whether the PAD supply is above the higher threshold voltage $V_{TH}$. Signals based on the judgments are passed to a decision making unit 1030 comprising a regenerative circuit. The regenerative circuit maintains the state of the input signal between $V_{TL}$ and $V_{TH}$ on the rising edge, and between $V_{TH}$ and $V_{TL}$ on the falling edge. The decision making unit 1030 then outputs a final signal $V_{OUT}$. Due to the incorporation of the compensation components and the supply tracking bias units, the final output signal $V_{OUT}$ demonstrates reduced hysteresis window variation and reduced DC bias level offset from the center of the hysteresis window.

Figure 11:
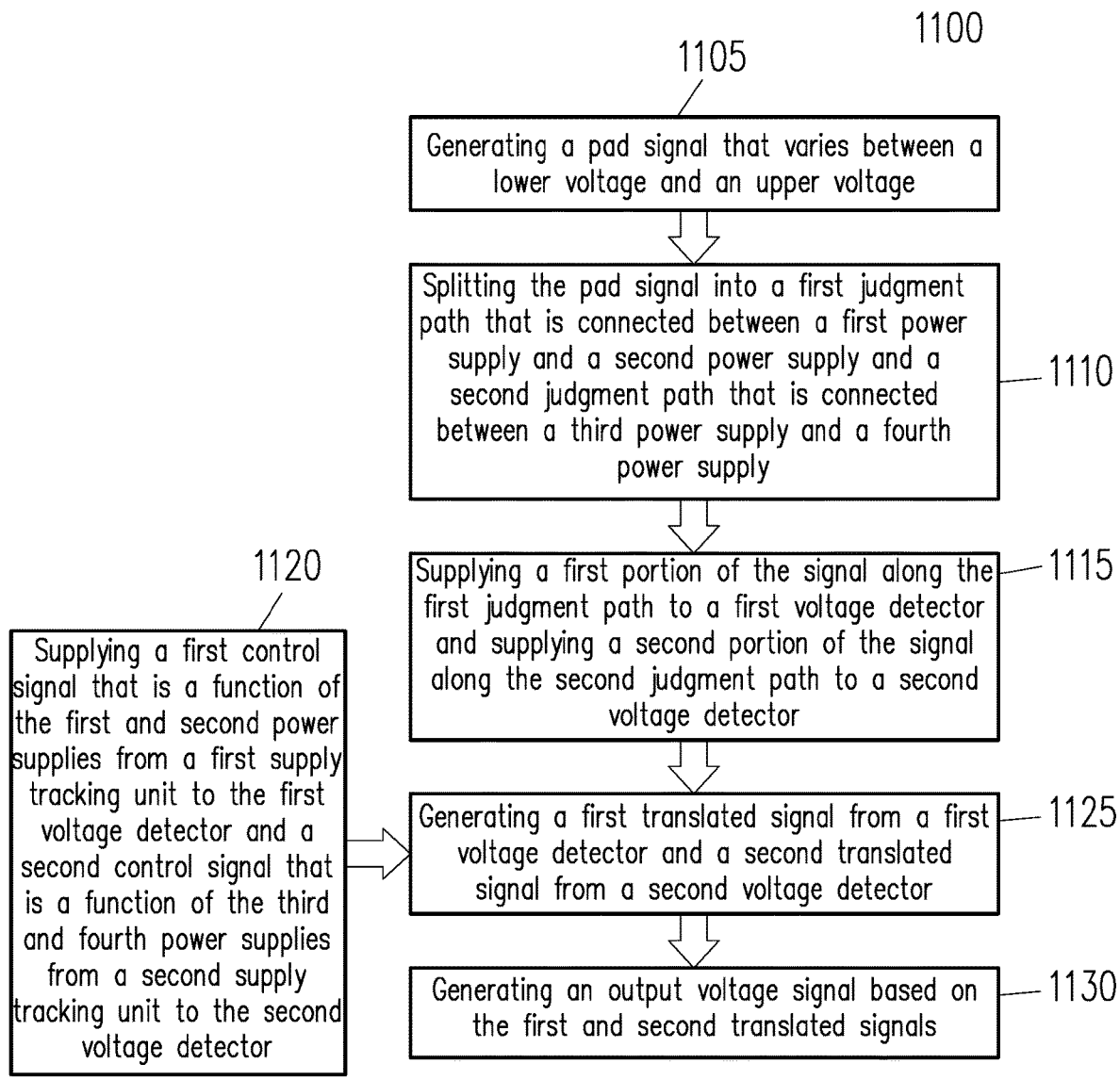
FIG. 11 is a flowchart depicting a method of providing an input hysteresis buffer in accordance with an embodiment.

FIG. 11 is a flow chart depicting a method 1100 of providing an input hysteresis buffer in accordance with various embodiments of the present disclosure. The method begins at step 1105 by generating a pad signal. The pad signal alternates between a lower voltage value and an upper voltage value. For example, the pad signal may be generated by an overdriven crystal oscillator driver and can alternate between VSS and VDD. At step 1110, the pad signal may be split into a number of judgment paths. For example, the pad signal may be split into a low threshold voltage judgment path and a high threshold judgment path by providing a low-side voltage limiter and high-side voltage limiter in parallel. The low threshold voltage judgement path may include components that are connected between a first power supply a second power supply, while the upper threshold voltage judgment path may include components that are connected between a third power supply and a fourth power supply. For example, the low threshold voltage judgment path may be connected between VSS and an intermediate voltage VDDL, while the upper threshold voltage judgment path may be connected between an intermediate voltage VSSH and VDD.

The signals on each path are then supplied to voltage detectors on the paths at 115. In an embodiment, the low threshold voltage judgment path may comprise a low-side voltage detector and a first portion of the input signal may be supplied to the low-side voltage detector. Similarly, the upper threshold voltage judgment path may comprise a high-side voltage detector and a second portion of the input signal may be supplied to the high-side voltage detector.

The judgment paths result in translated signals generated by the voltage detectors at step 1125. To provide reliable performance and compensation against PVT variation, control signals are also supplied to the voltage detectors within the judgment paths at step 1115. The voltage detectors comprise may plurality of compensation components including a controlled resistance component. Control signals may be supplied at step 1115 by supply tracking bias units. For example, a first supply tracking bias unit may supply a first control signal to the first voltage detector, and a second supply tracking bias unit may supply a second control signal to the second voltage detectors. The first supply tracking bias unit is connected between the first power supply and second supply, and the second supply tracking bias unit is connected between the third power supply and the fourth power supply. As described previously with reference to FIGS. 7-8, the signals generated by each supply tracking unit may be functions of the power supplies to which they are connected. The control signals supplied at 1115 are provided to control the resistance of the controlled resistance components of the voltage detectors so as to compensate against variations in the higher and lower threshold voltages.

The translated signals generated at step 1125 are square waves that have a value depending on whether or not the pad signal is above one of the threshold voltages. For example, the translated signal on the low threshold voltage judgment path has a maximum value when the portion of the pad signal along the path is above the low threshold voltage, and a minimum voltage when the portion of the pad signal along the path is below the low threshold voltage. Accordingly, the translated signal on the high voltage path has a maximum value when the portion of the pad signal along the high threshold voltage judgment path is above the high threshold voltage, and a minimum voltage when the portion of the pad signal along the path is below the high threshold voltage.

At step 1130, an output voltage signal is generated based on the translated signals. For example, the translated signals on each judgment path are output to a decision making unit. The decision making unit may use logic gates, or any other means, to compare and evaluate the translated signals. The decision making unit is configured such that the output voltage signal defines a hysteresis between the low threshold voltage and the high voltage signal. As such, the output voltage signal switches from low to high when the input voltage from the pad signal rises above the high threshold voltage, and switches from high to low when the input voltage from the pad signal falls below the low threshold voltage. The generated output signal has sharp edges and low phase noise and can be passed along to other devices in a circuit design with high reliability.

Circuits and methods are described herein. In one example, a circuit includes a voltage limiting unit, a voltage detecting unit connected to the voltage limiting unit, and a supply tracking bias unit connected to the voltage detecting unit. The voltage liming unit comprises a first voltage limiting unit and a second voltage limiting unit connected in parallel, and the voltage limiting unit is configured to split an input signal into a first path through the first voltage limiter and a second path through the second voltage limiter. The first voltage limiter is configured to connect to a first power supply and a second power supply and is configured to output a first modified signal that varies between a first minimum voltage corresponding to the first power supply and a first maximum voltage corresponding to the second power supply, with a first threshold voltage being between the first minimum voltage and first maximum voltage. The second voltage limiter is configured to connect to a third power supply and a fourth power supply and is configured to output a second modified signal that varies between a second minimum voltage corresponding to the third power supply and a second maximum voltage corresponding to the fourth power supply, with a second threshold voltage being between the second minimum voltage and second maximum voltage. The voltage detecting unit comprises a first voltage detecting unit configured to detect the presence of the first threshold voltage in the first modified signal, and a second voltage detecting unit configured to detect the presence of the second threshold voltage in the second modified signal. The supply tracking bias unit comprises a first unit connected to the first voltage detector and a second unit connected to the second voltage detector, wherein the first unit is configured to supply a first control signal to the first voltage detector that varies in response to variations of the first power supply or the second power supply, and the second unit is configured to supply a second control signal to the second voltage detector that varies in response to variations of the third power supply or the fourth power supply.

In another example, a circuit for an oscillator comprises an oscillator driver configured to output a pad signal. The circuit further comprises a higher threshold voltage judgment unit configured to receive the pad signal generate a first judgment output, and a lower threshold voltage judgment unit configured to receive the pad signal and generate a second judgment output. A supply tracking bias unit is included and configured to supply a first control signal to the higher threshold judgment unit, the first control signal being configured to compensate for variations in a higher threshold voltage, and a second control signal to the lower threshold voltage judgment units, the second control signal being configured to compensate for variations in a lower threshold voltage. The first and second judgment outputs are received by a decision making unit configured to deliver an output signal based on the first and second judgment outputs.

In an example method of providing an input hysteresis buffer, a pad signal that varies between a minimum voltage and a maximum voltage is generated. The pad signal is split into a first judgment path and a second judgment path, wherein the first judgment path supplies a first portion of the pad signal to a first voltage detector, and the second judgment path supplies a second portion of the pad signal to a second voltage detector. The first voltage detector is connected between a first power supply and a second power supply, and the second voltage detector is connected between a third power supply and a fourth power supply. A first control signal is supplied to the first voltage detector and a second control signal to the second voltage detector. The first control signal is a function of the first power supply and the second power supply and is generated by a first supply tracking bias unit. The second control signal is a function of the third power supply and the fourth power supply and is generated by a second supply tracking bias unit. A first translated signal is generated by the first voltage detector, wherein the first translated signal has a low value when the first portion of the pad signal is below a first threshold voltage level and a high value when the first portion of the pad signal is above the first threshold voltage level. A second translated signal is generated by the second voltage detector, wherein the second translated signal has a low value when the second portion of the pad signal is below a second threshold voltage level and a high value when the second portion of the pad signal is above the second threshold voltage level. An output voltage signal is generated signal based on the first translated signal and the second translated signal such that the output voltage signal defines a hysteresis window between the first threshold voltage and the second threshold voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the scope of the present disclosure.

What is claimed is:

1. A circuit, comprising:
a voltage limiting unit comprising a first voltage limiter and a second voltage limiter connected in parallel, wherein the voltage limiting unit is configured to split an input signal into a first path through the first voltage limiter and a second path through the second voltage limiter, wherein:
the first voltage limiter is configured to connect to a first power supply and a second power supply and is configured to output a first modified signal that varies between a first minimum voltage corresponding to the first power supply and first a maximum voltage corresponding to the second power supply, the first minimum voltage and the first maximum voltage having a first threshold voltage therebetween, and
the second voltage limiter is configured to connect to a third power supply and a fourth power supply and is configured to output a second modified signal that varies between a second minimum voltage corresponding to the third power supply and a second maximum voltage corresponding to the fourth power supply, the second minimum voltage and second maximum voltage having a second threshold voltage therebetween;
a voltage detecting unit connected to the voltage limiting unit comprising a first voltage detector connected to the first voltage limiter and configured to detect the first threshold voltage in the first modified signal, and a second voltage detector connected to the second voltage limiter and configured to detect the second threshold voltage in the second modified signal; and
a supply tracking bias unit connected to the voltage detecting unit, the supply tracking bias unit comprising a first unit connected to the first voltage detector and a second unit connected to the second voltage detector, wherein the first unit is configured to supply a first control signal to the first voltage detector that varies in response to variations of the first power supply or the second power supply, and the second unit is configured to supply a second control signal to the second voltage detector that varies in response to variations of the third power supply or the fourth power supply.

2. The circuit of claim 1, wherein the first voltage detector is configured to connect to the first power supply and the second power supply;
the second voltage detector is configured to connect to the third power supply and the fourth power supply;
the first unit comprises a first signal generator configured to supply the first control signal; and
the second unit comprises a second signal generator configured to supply the second control signal.

3. The circuit of claim 1, wherein the first voltage detector comprises:
a first complimentary metal-oxide-semiconductor (CMOS) inverter and a first plurality of compensation components; and
wherein the second voltage detector comprises a second CMOS inverter and a second plurality of compensation components.

4. The circuit of claim 3, wherein the first compensation components comprise:
a first transistor connected between the first power supply and the first CMOS inverter; and
a controlled resistance component connected between the first CMOS inverter and the second power supply.

5. The circuit of claim 4, wherein the controlled resistance component comprises a second transistor, the resistance of the second transistor being controlled by the first unit.

6. The circuit of claim 5, wherein first unit is connected to a gate of the second transistor.

7. The circuit of claim 3, wherein the second voltage detector comprises:
a first transistor connected between the third power supply and the second CMOS inverter; and
a controlled resistance component connected between the second CMOS inverter and the fourth power supply.

8. The circuit of claim 7, wherein the controlled resistance component comprises a second transistor, the resistance of the second transistor being controlled by the second unit.

9. The circuit of claim 8, wherein the second unit is connected to a gate of the second transistor.

10. The circuit of claim 1, wherein the first threshold voltage is lower than the second threshold voltage.

11. A circuit for an oscillator, comprising:
an oscillator driver configured to output a pad signal;
a higher threshold voltage judgment unit configured to receive the pad signal generate a first judgment output;
a lower threshold voltage judgment unit configured to receive the pad signal and generate a second judgment output;
a supply tracking bias unit configured to supply a first control signal to the higher threshold judgment unit, the first control signal configured to compensate for variations in a higher threshold voltage, and a second control signal to the lower threshold voltage judgment unit, the second control signal configured to compensate for variations in a lower threshold voltage, wherein the higher threshold voltage judgment unit comprises a high-side voltage limiter and is configured to detect the higher threshold voltage; and
a decision making unit configured to deliver an output signal based on the first and second judgment outputs.

12. The circuit of claim 11, wherein the oscillator driver comprises a self-biasing buffer with non-rail-to-rail signal.

13. The circuit of claim 11, wherein the higher threshold voltage judgment unit further comprises a first voltage detector for detecting the higher threshold voltage; and
the lower threshold voltage judgment unit comprises a low-side voltage limiter and a second voltage detector for detecting the lower threshold voltage.

14. The circuit of claim 13, wherein the pad signal varies between a first voltage value that is lower than the lower threshold voltage and a second voltage value that is higher than the higher threshold voltage; and
   an average value of the first voltage value and the second voltage value is equal to an average value of the lower threshold voltage and the higher threshold voltage.

15. The circuit of claim 14, wherein the first control signal is a function of the second voltage value; and
   the second control signal is a function of the first voltage value.

16. The circuit of claim 13, wherein the output signal generates a hysteresis window between the lower threshold voltage and the higher threshold voltage.

17. The circuit of claim 11, wherein the decision making unit comprises a regenerative circuit.

18. A method of operating a circuit, comprising:
   generating a pad signal that varies between a lower voltage and an upper voltage;
   splitting the pad signal into a first judgment path and a second judgment path, wherein the first judgment path supplies a first portion of the pad signal to a first voltage detector that is connected between a first power supply and a second power supply, and the second judgment path supplies a second portion of the pad signal to a second voltage detector that is connected between a third power supply and a fourth power supply;
   supplying a first control signal that is a function of the first power supply and the second power supply to the first voltage detector, wherein the first control signal is generated by a first supply tracking bias unit;
   supplying a second control signal that is a function of the third power supply and the fourth power supply to the second voltage detector, wherein the second control signal is generated by a second supply tracking bias unit;
   generating a first translated signal from the first voltage detector, wherein the first translated signal has a low value when the first portion of the pad signal is below a first threshold voltage level and a high value when the first portion of the pad signal is above the first threshold voltage level;
   generating a second translated signal from the second voltage detector, wherein the second translated signal has a low value when the second portion of the pad signal is below a second threshold voltage level and a high value when the second portion of the pad signal is above the second threshold voltage level; and
   generating an output voltage signal based on the first translated signal and the second translated signal such that the output voltage signal defines a hysteresis window between the first threshold voltage and the second threshold voltage.

19. The method of claim 18, wherein the first control signal controls a resistance of a component within the first voltage detector such that variations in the first threshold voltage are compensated; and
   the second control signal controls a resistance of a component within the second voltage detector such that variations in the second threshold voltage are compensated.

20. The method of claim 18, wherein the pad signal is generated by an overdriven crystal oscillator unit.

* * * * *